United States Patent
Botnar et al.

(10) Patent No.: US 11,454,692 B2
(45) Date of Patent: Sep. 27, 2022

(54) METHOD OF PERFORMING MAGNETIC RESONANCE IMAGING AND A MAGNETIC RESONANCE APPARATUS

(71) Applicants: Siemens Healthcare Limited, Camberley (GB); King's College London, London (GB)

(72) Inventors: Rene Botnar, London (GB); Giulia Ginami, London (GB); Radhouene Neji, London (GB); Claudia Prieto, London (GB)

(73) Assignee: Siemens Healthcare GmbH, Erlangen (DE)

( * ) Notice: Subject to any disclaimer, the term of this patent is extended or adjusted under 35 U.S.C. 154(b) by 947 days.

(21) Appl. No.: 16/108,573

(22) Filed: Aug. 22, 2018

(65) Prior Publication Data
US 2019/0064299 A1    Feb. 28, 2019

(30) Foreign Application Priority Data
Aug. 22, 2017    (GB) .................................... 1713442

(51) Int. Cl.
*G01R 33/567*    (2006.01)
*G01R 33/48*     (2006.01)
(Continued)

(52) U.S. Cl.
CPC ......... *G01R 33/5673* (2013.01); *G01R 33/36* (2013.01); *G01R 33/4818* (2013.01);
(Continued)

(58) Field of Classification Search
None
See application file for complete search history.

(56) References Cited

U.S. PATENT DOCUMENTS 9,131,870 B2    9/2015    Kim
9,149,203 B2    10/2015    Kim
(Continued)

OTHER PUBLICATIONS

Liu et al. "Flow-Independent T2-Prepared Inversion Recovery Black-Blood MR Imaging" Journal of Magnetic Resonance imaging, vol. 31, pp. 248-254 (2010).
(Continued)

*Primary Examiner* — Patrick Assouad
*Assistant Examiner* — Haidong Zhang
(74) *Attorney, Agent, or Firm* — Banner & Witcoff Ltd.

(57) ABSTRACT

In a method of performing magnetic resonance (MR) imaging, an MR apparatus, and a computer-readable medium during a first cardiac cycle of a subject, a first imaging sequence is generated for application to a subject. The first imaging sequence has a preparatory pulse and an inversion recovery pulse following the preparatory pulse. First signals emitted from the subject in response to the first imaging sequence are detected, and first image data are generated based on the first signals. During a second cardiac cycle following the first cardiac cycle, a second imaging sequence is generated for application to the subject. The second imaging sequence has a preparatory pulse. Second signals emitted from the subject in response to the second imaging sequence are detected, and second image data are generated based on the second signals.

15 Claims, 4 Drawing Sheets

(51) Int. Cl.
  *G01R 33/56* (2006.01)
  *G01R 33/50* (2006.01)
  *G01R 33/36* (2006.01)
  *G01R 33/561* (2006.01)

(52) U.S. Cl.
  CPC ......... *G01R 33/4826* (2013.01); *G01R 33/50* (2013.01); *G01R 33/5602* (2013.01); *G01R 33/5605* (2013.01); *G01R 33/5607* (2013.01); *G01R 33/5614* (2013.01)

(56) References Cited

U.S. PATENT DOCUMENTS

| | | | |
|---|---|---|---|
| 9,256,977 B2 | 2/2016 | Rehwald et al. | |
| 2008/0114236 A1* | 5/2008 | Sugiura | A61B 5/055 600/413 |
| 2011/0260725 A1 | 10/2011 | Mordini et al. | |
| 2012/0101367 A1* | 4/2012 | Kim | A61B 5/055 600/413 |
| 2013/0211239 A1* | 8/2013 | Wang | G01R 33/561 600/420 |
| 2013/0285655 A1* | 10/2013 | Miyazaki | G01R 33/5608 324/309 |
| 2015/0070015 A1 | 3/2015 | Greiser | |

OTHER PUBLICATIONS

Xie, Jingsi et al., "3D Flow-Independent Peripheral Vessel Wall Imaging Using T2-Prepared Phase-Sensitive Inversion-Recovery Steady-State Free Precession", Journal of Magnetic Resonance Imaging, 32, (2010), DOI:10.1002/jmri.22272, (pp. 399-408, 10 total pages); 2010.

Yibin X. et al.; "Coronary atherosclerosis T1-weighed characterization with integrated anatomical reference: comparison with high-risk plaque features detected by invasive coronary imaging"; JACC Cardiovasc Imaging; Jun. 2017; 10(6):637-648. doi: 10.1016/j.jcmg.2016.06.014. Epub Oct. 12, 2016.

P. Kellman et al., "Phase-Sensitive Inversion Recovery for Detecting Myocardial Infarction Using Gadolinium-Delayed Hyperenhancement," Magnetic Resonance in Medicine, 47(2), pp. 372-383, 2002.

* cited by examiner

METHOD OF PERFORMING MAGNETIC RESONANCE IMAGING AND A MAGNETIC RESONANCE APPARATUS

BACKGROUND OF THE INVENTION

Field of the Invention

The present invention relates to a method of performing magnetic resonance imaging and a magnetic resonance apparatus. In particular, the present invention relates to a method of performing magnetic resonance imaging and a magnetic resonance apparatus for generating images during first and second cardiac cycles of a subject.

Description of the Prior Art

Magnetic resonance (MR) imaging is used for non-invasive coronary lumen, thrombus/hemorrhage, and plaque visualization in subjects suffering from coronary artery disease (CAD).

Such visualization in subjects has been demonstrated using a 3D black-blood non-contrast enhanced T1-weighted inversion recovery (IR) sequence. This sequence exploits the short T1 of methemoglobin that is present in acute thrombus and intraplaque hemorrhage. Because the signal from background tissue appears suppressed in T1-weighted black-blood images, an additional bright-blood image is typically required as an anatomical reference. The acquisition of the black-blood and bright-blood images are typically acquired sequentially such that the T1-weighted black-blood images are acquired during odd heartbeats (i.e. the $1^{st}$, $3^{rd}$, $5^{th}$, $7^{th}$, ... etc. heartbeats during the MR sequence), and the bright-blood images are acquired during even heartbeats (i.e. the $2^{nd}$, $4^{th}$, $6^{th}$, $8^{th}$ ... etc. heartbeats in the MR sequence).

In another example, late gadolinium enhancement imaging has been performed to allow for the assessment of pathological conditions including myocardial infarction and myocarditis. In this example, phase sensitive inversion recovery acquisitions are segmented over two consecutive heartbeats. In a first heartbeat, a T1-weighted image is acquired after the application of a non-selective IR pulse, and a low flip-angle reference image is acquired in the second heartbeat. The T1-weighted image and the reference image are then combined. This approach results in 2D image data acquisitions, and requires that the subject holds his or her breath during the procedure, so as to minimize respiratory motion artifacts.

SUMMARY OF THE INVENTION

It is an object of the present disclosure to improve on these existing methods of performing MR imaging, or at least provide an alternative way of performing MR imaging.

According to a first aspect of the present invention, there is provided a method of performing magnetic resonance (MR) imaging includes, during a first cardiac cycle of a subject, generating a first imaging sequence for application to a subject, the first imaging sequence having a preparatory pulse and an inversion recovery pulse following the preparatory pulse, and detecting first signals emitted from the subject in response to the first imaging sequence; generating first image data based on the first signals. The method further includes, during a second cardiac cycle immediately following the first cardiac cycle; generating a second imaging sequence for application to the subject, the second imaging sequence having a preparatory pulse, and detecting second signals emitted from the subject in response to the second imaging sequence; generating second image data based on the second signals. The first and second image data are combined to produce composite image data, wherein the second imaging sequence does not include an inversion recovery pulse following the preparatory pulse, and wherein the preparatory pulse for the first and/or the second imaging sequence is a magnetization transfer contrast (MTC) pulse or a train of MTC pulses.

Here, a "cardiac cycle" refers to the sequence of mechanical and electrical events that repeats with every heartbeat. This means that the first image data may be considered as being obtained during a first heartbeat, and the second image data may be considered as being obtained during a second heartbeat immediately following the first heartbeat. The first heartbeat may be considered as an odd heartbeat, and the second heartbeat may be considered as an even heartbeat. It will be appreciated that he use of odd/even confers no meaning other than a numerical order.

The use of a preparatory pulse in combination with an inversion recovery pulse during a first cardiac cycle, and the use of a preparatory pulse during a second cardiac cycle (immediately) following the first cardiac cycle, means that the present disclosure is able to obtain useful image data during both odd heartbeats (e.g. the first cardiac cycle) and even heartbeats (e.g. the second cardiac cycle). Therefore, and unlike in existing approaches, the data acquired during even heartbeats is not only useful for phase sensitive inversion recovery (PSIR) reconstruction, but it also provides useful information for the medical professional, such as for use in diagnostics. This helps to increase the efficiency of the acquisition as each acquired image provides diagnostic information for the medical professional at no extra scan time.

The first signals and the second signals may be emitted from one or more portions of the subject's heart. The first and second image data may be cardiac image data. The first and second image data may be of the same region of the subject.

The method may further include repeating the generation of the first and second imaging sequences during a plurality of cardiac cycles so as to generate a first image dataset and a second image dataset. The first/second image datasets include multiple sets of first/second image data. Each of the first/second image data sets may represent a 2D image, or the first/second image dataset may represent a 3D image volume. The total time duration for the multiple first and second imaging sequences may be between 10 to 14 minutes.

Repeating the generation of the first and second imaging sequences may mean that first and second image data representing different regions of k-space are generated over a number of cardiac cycles. Repeating the generation of first and second imaging sequences means repeating the first and second imaging sequences until all the desired segments of k-space are acquired. During the first imaging sequence, k-space can be traversed using a 3D Cartesian trajectory with a spiral profile order. Over the number of first imaging sequences, a volume of k-space may be traversed along this trajectory. During the second imaging sequence, k-space can be traversed using a 3D Cartesian trajectory with a spiral profile order. Over the number of second imaging sequences, a volume of k-space may be traversed along this trajectory.

The first image dataset can represent a first 3D image volume. The second image dataset can represent a second 3D image volume. The first image dataset and the second image dataset can represent the same 3D volume in the subject. The first image dataset can represent a first 3D cardiac image. The second image dataset can represent a second 3D cardiac image. The first 3D cardiac image and the second 3D cardiac image can be of the same cardiac region in the subject. The cardiac region can be all or part of the subject's heart.

The second cardiac cycle immediately follows the first cardiac cycle.

The first and second image data may be bright-blood image data. This may mean that the first and second imaging sequences are chosen such that the signals produced by blood are enhanced, and appear bright in the image data.

The composite image data may be black-blood image data. This means that the signals produced by blood are reduced, and appear dark in the image. This provides for the identification of scar tissue in the composite image, while enabling the first and second image data to be used for heart anatomy information and coronary MR angiography. Combining the first and second image data may be performed using a phase sensitive inversion recovery (PSIR) reconstruction algorithm. The first and second image dataset may be combined to produce a composite image dataset.

The first and second image data/datasets may be co-registered prior to combining to produce composite image data. Co-registering the first and second image data/datasets may include correcting for motion in the first and second image data/datasets.

The first and/or second imaging sequence can further comprise a motion estimation sequence following the preparatory pulse. The motion estimation sequence can include a respiratory navigator. The respiratory navigator can be a 2D imaged based navigator (iNAV). The motion estimation sequence can precede the image acquisition. The method can further include using the motion estimation sequence to correct for subject motion. The motion estimation can include estimating the translational respiratory motion along the superior-inferior and left-right direction at each heart-beat.

The preparatory pulse for the first and/or the second imaging sequence can function so as to selectively suppress the signal of one or more tissue types or other aspects of the subject. The preparatory pulse can have a duration of 40 ms.

The second imaging sequence can include a fat saturation pulse following the preparatory pulse. The second imaging sequence can have a high flip-angle.

The first and/or the second imaging sequence can include balanced localizing gradients. The balanced localizing gradients can be selected such that a volume of k-space may be traversed using a 3D Cartesian trajectory with spiral profile order over the plurality of first imaging sequences and/or second imaging sequences. The first and/or second imaging sequence can be selected such that a 3D cardiac region is imaged over the number of first imaging sequences and/or second imaging sequences. The 3D cardiac region can be a whole-heart cardiac region.

First imaging sequence can use a short inversion recovery (STIR) approach where the signals are detected a short time after the inversion recovery pulse. This can suppress fat signals. The inversion time, TI, can be between 90-250 ms.

The first and second imaging sequences can be performed with or without the injection of a contrast agent. The first and second imaging sequences may be adapted to different clinical investigations by changing the preparatory pulses. The method can be for use in late gadolinium enhancement imaging. The method can be for use in free-breathing MR imaging. Free-breathing means that the subject is not required to hold his or her breath during the imaging procedure.

The method can be used in non-invasive coronary lumen, thrombus/hemorrhage, and/or plaque visualization imaging in subjects suffering from coronary artery disease (CAD). The method can be used in imaging myocardial scar tissue or peripheral blood vessels.

According to a second aspect of the invention, a magnetic resonance (MR) apparatus has a gradient system to apply a gradient magnetic field; an excitation system to apply an excitation pulse to a subject and to receive signals from the subject; and a computing system to receive the signals from the excitation system, the computing system being configured to execute program code so as to control the gradient system and the excitation system, during a first cardiac cycle of a subject, to generate a first imaging sequence for application to the subject, the first imaging sequence comprising a preparatory pulse and an inversion recovery pulse following the preparatory pulse, and to detect first signals emitted from the subject in response to the first imaging sequence; generate first image data based on the first signals; control the gradient system and the excitation system, during a second cardiac cycle immediately following the first cardiac cycle, to generate a second imaging sequence for application to the subject, the second imaging sequence comprising a preparatory pulse, and to detect second signals emitted from a subject in response to the second imaging sequence; and generate second image data based on the second signals; and combine the first and second image data to produce composite image data, wherein the second imaging sequence does not comprise an inversion recovery pulse following the preparatory pulse, and wherein the preparatory pulse for the first and/or the second imaging sequence is a magnetization transfer contrast (MTC) pulse or a train of MTC pulses.

The MR apparatus may be arranged to perform the method of the first aspect.

According to a third aspect of the invention, a non-transitory computer-readable data storage medium is encoded with programming instructions (program code) that, when executed by a processor, cause the processor or computer or computer system to perform the method of the first aspect of the invention.

DESCRIPTION OF THE PREFERRED EMBODIMENTS

Figure 1:
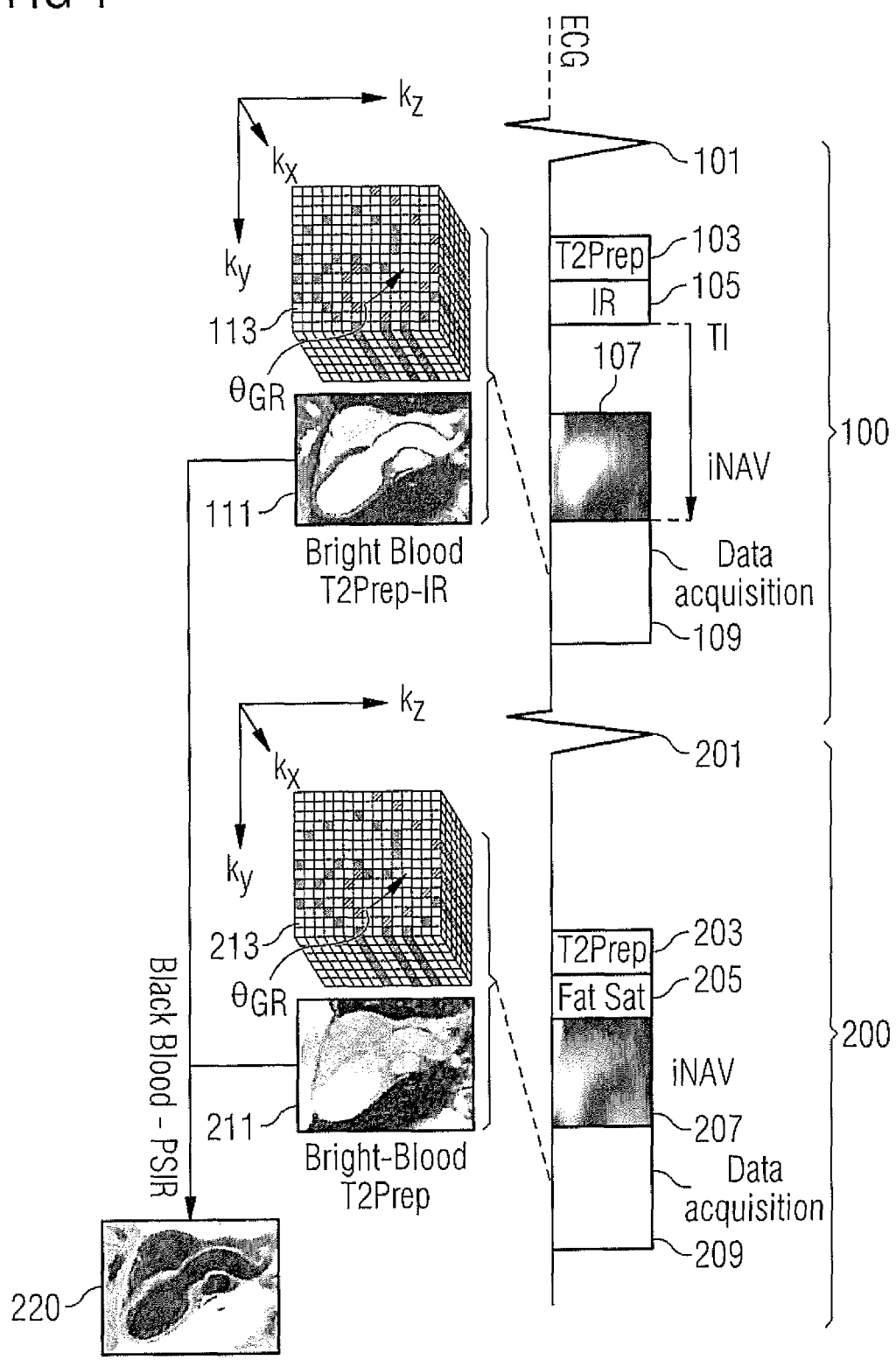
FIG. 1 schematically illustrates an MR pulse sequence diagram not according to the present invention.

Referring to FIG. 1, there is shown a schematic of an MR pulse sequence chart not according to the present invention. Two imaging sequences are shown during first and second cardiac cycles 100, 200 of a subject. The second cardiac cycle 200 is shown immediately following the first cardiac cycle 100. The cardiac cycles 100, 200 can be considered as the time periods between consecutive ECG pulses 101, 201. This example MR pulse sequence is used for coronary lumen and plaque characterization without the use of a contrast agent.

The first cardiac cycle 100 begins with ECG pulse 101. The first imaging sequence is ECG-gated, meaning that the generation of the first imaging sequence is triggered by the ECG pulse 101. The first imaging sequence comprises a preparatory pulse 103 in the form of a T2 preparatory pulse 103, an inversion recovery pulse 105 following the T2 preparatory pulse 103, a motion estimation sequence 107 following the inversion recovery pulse 105, and data acquisition 109 following the motion estimation sequence 107. The inversion recovery pulse 105 is generated soon after the generation of the T2 preparatory pulse 103. The data acquisition 109 is performed an inversion time TI after the generation of the inversion recovery pulse 105. The TI is selected to be a short TI such that the first imaging sequence uses a short inversion recovery (STIR) approach where the signals are detected a short time after the inversion recovery pulse. This aids in the suppression of fat signals. The motion estimation sequence 107 is generated shortly before the data acquisition 109.

During data acquisition 109, first signals emitted from the subject in response to the first imaging sequence are detected. First image data 111 are generated based on these first signals. The first image data 111 is bright blood image data 111, and the signals produced by blood are enhanced, and appear bright in the image data. The first image data 111 are shown in the form of a 2D image.

The second cardiac cycle 200 begins with ECG pulse 201. The second imaging sequence is ECOG-gated, meaning that the generation of the second imaging sequence is triggered by the ECG pulse 201. The second imaging sequence comprises a preparatory pulse 203 in the form of a T2 preparatory pulse 203, a fat saturation pulse 205 following the T2 preparatory pulse 203, a motion estimation sequence 207 following the fat saturation pulse 205, and data acquisition 209 following the motion estimation sequence 207. The fat saturation pulse 205 is generated shortly after the generation of the T2 preparatory pulse 203. The motion estimation sequence 207 is generated shortly after the fat saturation pulse 205. The data acquisition 209 is performed shortly after the motion estimation sequence 207. There is no inversion recovery pulse following the T2 preparatory pulse 203 in the second imaging sequence.

During data acquisition 209, second signals emitted from the subject in response to the second imaging sequence are detected. Second image data 211 are generated based on these second signals. The second image data 211 are a bright blood image data 211, and the signals produced by blood are enhanced, and appear bright in the image data. Data acquisition 209 uses a high flip-angle. The second image data 211 are shown in the form of a 2D image.

The first and second imaging sequences are repeated during a number of cardiac cycles 100, 200 so as to generate a first and second image datasets. In particular, the first imaging sequence is performed during odd heartbeats (i.e. the $1^{st}$, $3^{rd}$, $5^{th}$, $7^{th}$, . . . etc. heartbeats during the MR sequence), and the second imaging sequence is performed during the even heartbeats (i.e. the $2^{nd}$, $4^{th}$, $6^{th}$, $8^{th}$ . . . etc. heartbeats in the MR sequence). Repeating the generation of the first and second imaging sequences means that first and second image data 111, 211 representing different regions of k-space are generated over a plurality of cardiac cycles 100, 200. Each cardiac cycle results in the acquisition of a subset of k-space, and over a plurality of cardiac cycles 100, 200 this results in the generation of 3D image datasets for the odd and even heartbeats. In particular, during the first imaging sequence, a k-space volume 113 is traversed using a 3D Cartesian trajectory with spiral profile order. Further, during the second imaging sequence, a k-space volume 213 is traversed using a 3D-Cartesian trajectory with spiral profile order. During the multiple cardiac cycles, the subject is not required to hold his or her breath.

This repetition of the first and second imaging sequences means that two 3D image datasets can be acquired over several cardiac cycles 100, 200. That is, the acquisition of the 3D image datasets is segmented and the acquisition happens over several heartbeats. In addition, the imaging is performed in an alternated way to obtain two different 3D image datasets 100, 200 (i.e. one for the odd heartbeats, and one for the even heartbeats). The first image dataset represents a first 3D cardiac image. The second image dataset represents a second 3D cardiac image. The first and second 3D cardiac images are of the same cardiac region of the subject, but can have different image data due to the different properties of the first and second imaging sequences. For example, because the second imaging sequence does not have an inversion recovery pulse following the T2 preparatory pulse 203.

In both the first and second imaging sequences, the data acquisition 109, 209 includes generating localizing gradients. In one example, the localizing gradients are a balanced steady-state free precession (bSSFP) type sequences. The balanced localizing gradients are selected such that the volume of k-space 113, 213 is be traversed using a 3D Cartesian trajectory with spiral profile order over the plurality of first imaging sequences and second imaging sequences.

The motion estimation sequences 107, 207 include a respiratory navigator in the form of a low-resolution 2D imaged based navigator (iNAV). The motion estimation sequences 107, 207 enable 2D translation motion to be estimated from heartbeat to heartbeat for both the odd heartbeat images and even heartbeat images independently. In one example operation, a region-of-interest (ROI) for motion estimation is selected in the subject (e.g. around the heart/cardiac region) during acquisition planning. A template matching algorithm is then used to estimate superior-inferior and right-left translational motion using the first acquired iNAV of each dataset as a respiratory reference position. In this example, motion compensation is performed by modulating the acquired k-space data with a linear phase corresponding to a rigid translational shift in the image domain. After heartbeat-to-heartbeat respiratory motion correction, and before PSIR reconstruction, the two bright-blood volumes may be rigidly co-registered to the same respiratory position.

The first and second image data 111, 211 (datasets) are combined to produce composite image data 220 (dataset). The composite image data 220 are black-blood image data. The combining of the first and second image data 111, 211 uses a phase-sensitive inversion recovery (PSIR) reconstruction algorithm. The second image data 211 is used as a reference for the phase computation. The PSIR algorithm is a black-blood PSIR. The first and second image data 111, 211 are motion corrected, and co-registered before the PSIR reconstruction.

The composite black-blood image data 220 provide improved contrast, and the bright-blood image data 111, 211 provide sharp visualization of the coronary arteries and heart anatomy. The 3D dark-blood dataset obtained from the PSIR reconstruction provides high contrast and well-delineated depiction of myocardial scarring in the cardiac region.

Figure 2:
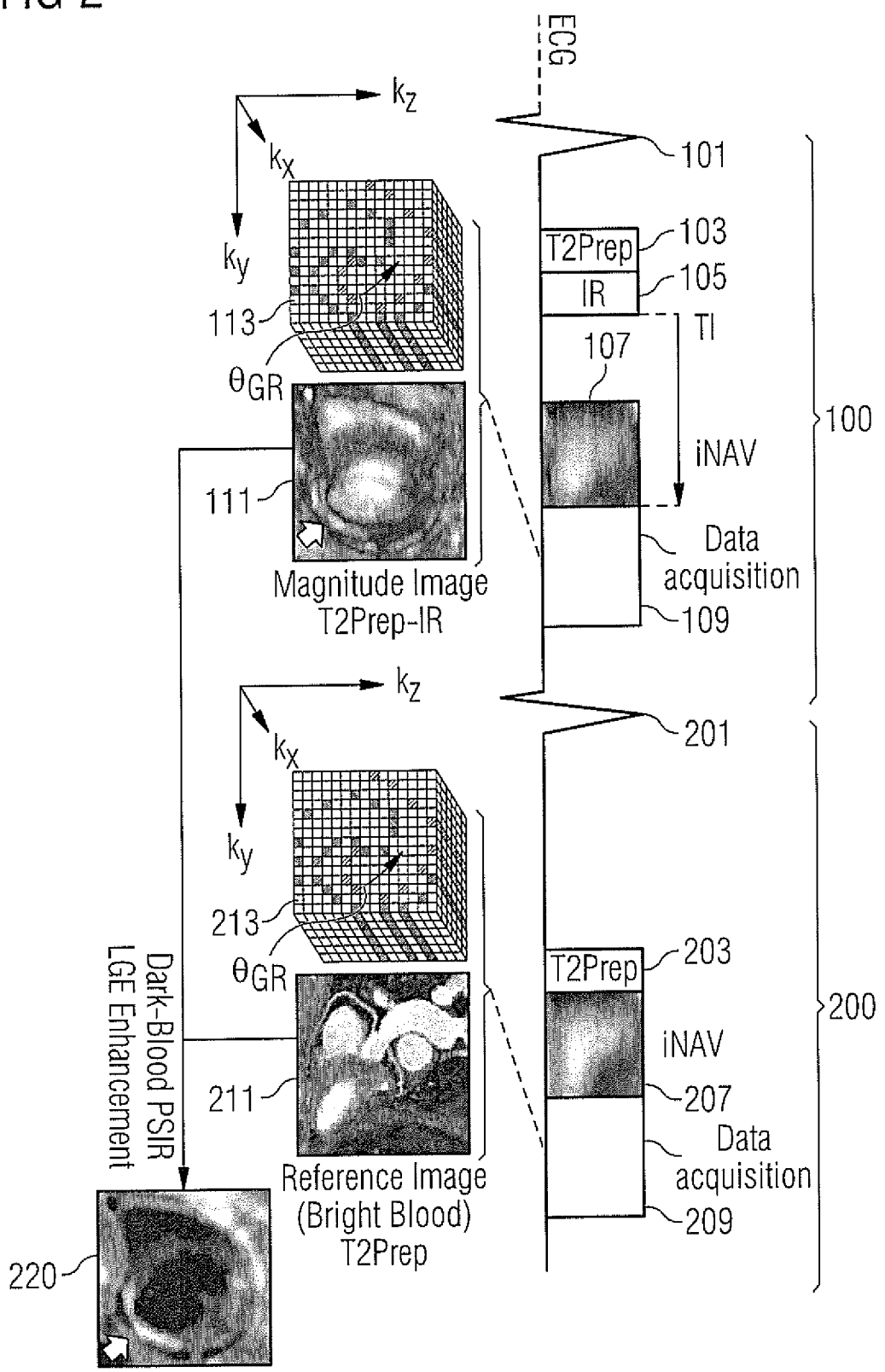
FIG. 2 schematically illustrates another MR pulse sequence diagram in accordance with an embodiment of the invention.

Referring to FIG. 2, there is shown another schematic of an MR pulse sequence chart. The MR pulse sequence chart shares similar features to the chart of FIG. 1, and the same reference numerals have been used to identify the same features. Two imaging sequences are shown during a first and second cardiac cycles 100, 200 of a subject. The second cardiac cycle 200 is shown immediately following the first cardiac cycle 100. This example MR pulse sequence is used for coronary lumen and late gadolinium enhancement with the use of contrast agent.

The first and second imaging sequences are the same as the first and second imaging sequence of FIG. 1. The fat saturation pulse present in the second imaging sequence is not expressly shown in FIG. 2, but will be understood to be included in the second imaging sequence of FIG. 2.

The first and second image data 111, 211 are bright blood image data 111, 211. In this example, the first image data 111 are used as magnitude image data, and the second image data 211 are used as reference image data. The first image data 111 and the second image data 211 are combined to form composite image data 220. The first image data 111 and the second image data 211 are combined using a PSIR reconstruction algorithm. The second image data 211 are used as a reference for the phase computation. The PSIR algorithm is a dark-blood late gadolinium enhancement PSIR.

Figure 3:
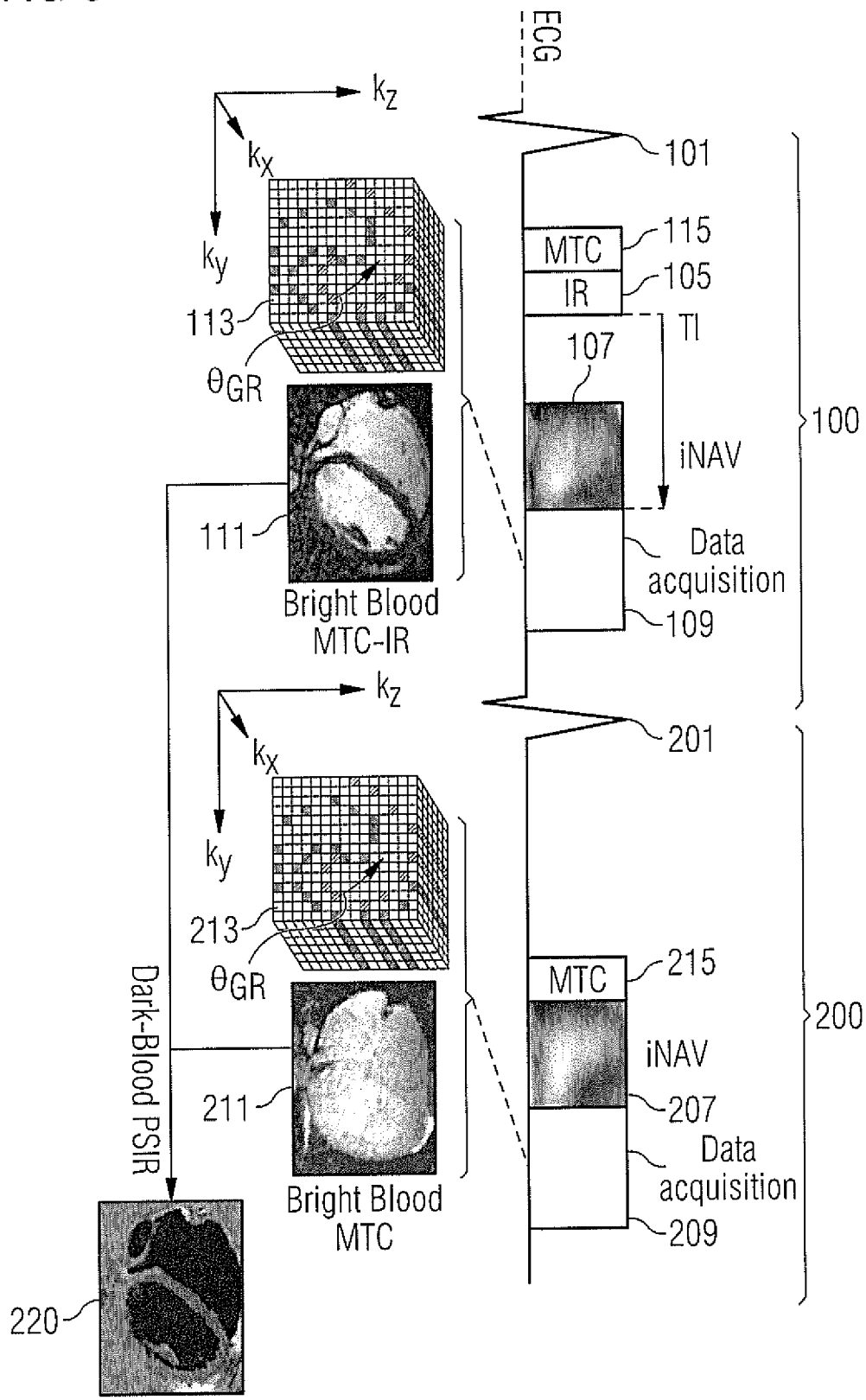
FIG. 3 schematically illustrates another MR pulse sequence diagram in accordance with an embodiment of the invention.

Referring to FIG. 3, there is shown another schematic of an MR pulse sequence chart. The MR pulse sequence chart shares similar features to the chart of FIG. 1, and the same reference numerals have been used to identify the same features. Two imaging sequences are shown during a first and second cardiac cycles 100, 200 of a subject. The second cardiac cycle 200 is shown immediately following the first cardiac cycle 100. This example MR pulse sequence is used for coronary sinus and late gadolinium enhancement with the use of contrast agent.

The first imaging sequence is the same as the first imaging sequence of FIG. 1 except that the T2 preparatory pulse is replaced with a magnetization transfer contrast (MTC) pulse (otherwise known as a magnetization transfer pulse (MT)) 115 or a train of MTC pulses 115. The second imaging sequence is the same as the second imaging sequence of FIG. 1 except that the T2 preparatory pulse is replaced with an MTC pulse 215 or a train of MTC pulses 215.

The first and second image data 111, 211 are bright blood image data 111, 211. The first image data 111 and the second image data 211 are combined to form composite image data 220. The first image data 111 and the second image data 211 are combined using a PSIR reconstruction algorithm. The second image data 211 is used as a reference for the phase computation. The PSIR algorithm is a dark-blood PSIR.

While motion estimation sequences are used in the above examples, it will be appreciated that these sequences are not required in all embodiments of the present disclosure.

Figure 4:
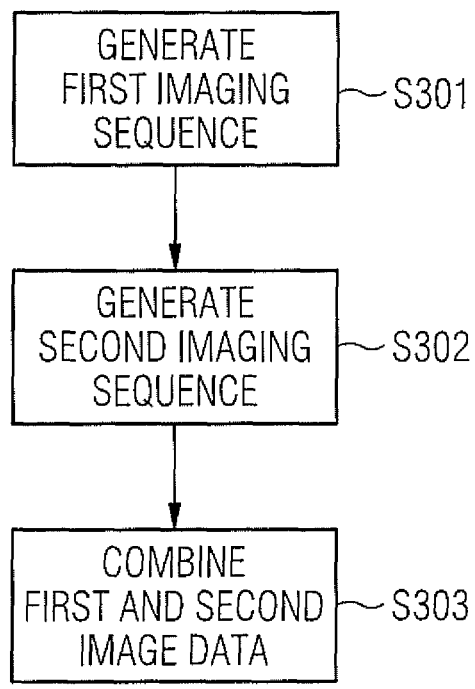
FIG. 4 is a flowchart of an embodiment of the method in accordance with the first aspect of the invention.

Referring to FIG. 4, there is shown an example method according to the first aspect of the disclosure.

Step 301 involves generating a first imaging sequence for application to a subject during a first cardiac cycle of a subject. The first imaging sequence comprises a preparatory pulse and an inversion recovery pulse following the preparatory pulse. Step 301 further involves detecting first signals emitted from the subject in response to the first imaging sequence, and generating first image data based on the first signals.

Step 302 involves generating a second imaging sequence for application to the subject during a second cardiac cycle following the first cardiac cycle. The second imaging sequence includes a preparatory pulse. Step 302 further involves detecting second signals emitted from the subject in response to the second imaging sequence, and generating second image data based on the second signals.

The first and second imaging sequences generated during steps 301 and 302 may be the same as the example imaging sequences described above in relation to FIGS. 1 to 3.

Step 303 involves combining the first and second image data to produce a composite image. The combining of the first and second image data may involve using PSIR reconstruction as described above in relation to FIGS. 1 to 3.

Figure 5:
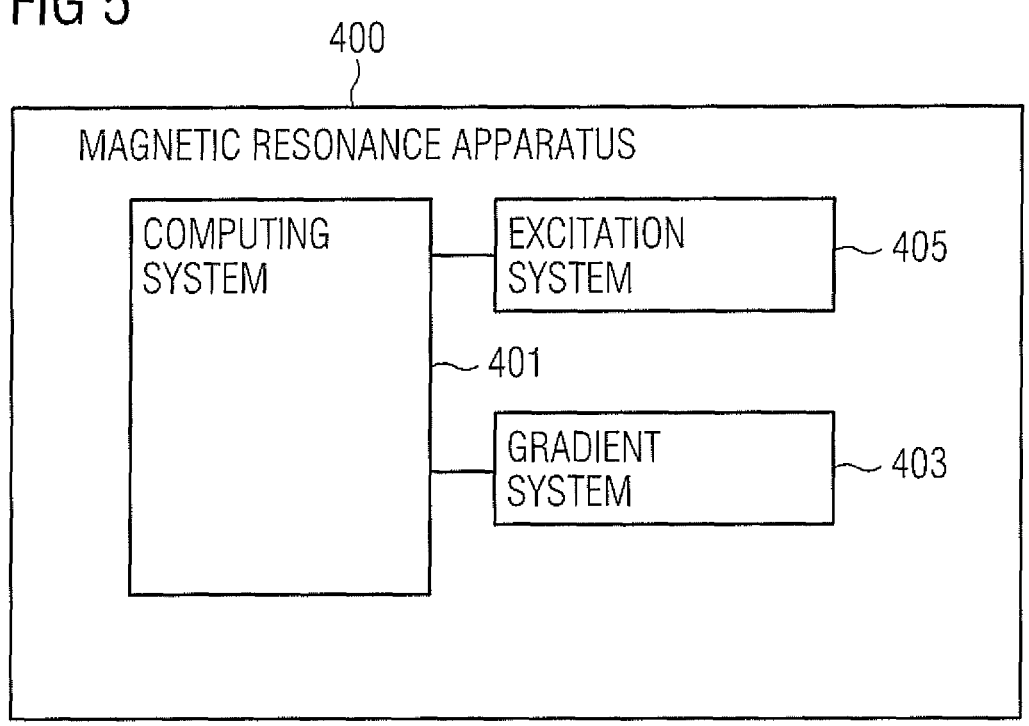
FIG. 5 is a block diagram of an MR apparatus in accordance with the second aspect of the invention.

Referring to FIG. 5, there is shown an example MR apparatus 400 according the second aspect of the disclosure. The MR apparatus 400 has a scanner with a gradient system 403, an excitation system 405, and also has a computing system 401. The gradient system 403 applies a gradient magnetic field. The excitation system 405 applies an excitation pulse to the subject and receives signals from the subject. The computing system 401 receives the signals from the excitation system 405.

The computing system 401 also executes program code to control the gradient system 403 and the excitation system 405, during a first cardiac cycle of a subject, to generate a first imaging sequence for application to the subject, and to detect first signals emitted from the subject in response to the first imaging sequence. The computing system 401 also executes program code to generate first image data based on the first signals. The first imaging sequence includes a preparatory pulse and an inversion recovery pulse following the preparatory pulse.

The computing system 401 also executes program code to control the gradient system 403 and the excitation system 405, during a second cardiac cycle following the first cardiac cycle, to generate a second imaging sequence for application to the subject, the second imaging sequence including a preparatory pulse, and to detect second signals emitted from a subject in response to the second imaging sequence. The computing system 401 also executes program code to generate second image data based on the second signals.

The scanner of the MR apparatus 400 includes a magnet (not shown) for establishing a stationary magnetic field. The magnet can include a permanent magnet, a superconducting magnet or other type of magnet. The excitation system 405 has a transmitter (not shown) and a receiver (not shown). The excitation system 405 can be an RF system with one or more RF coils (not shown). The gradient system 403 includes one or more coils (not shown) used to apply magnetic gradients for localization during MR imaging.

The computing system 401 is in communication with the gradient system 403 and excitation system 405 for controlling these components. The computing system 401 includes a processing circuitry (not shown) configured to execute program code for controlling the MR apparatus 400 to perform the method of the first aspect. The computing system 401 could be an integrated component of the MR apparatus 400. The computing system 401 could be a desktop computer, a workstation, a server, or a laptop computer.

According to a further aspect of the invention, a non-transitory computer-readable data storage medium is encoded with programming instructions (program code) that, when executed by the computer system 401, cause the computer system 401 to perform the method of the first aspect of the invention.

At least some of the example embodiments described herein may be constructed, partially or wholly, using dedicated special-purpose hardware. Terms such as 'component', 'module' or 'unit' used herein may include, but are not limited to, a hardware device, such as circuitry in the form of discrete or integrated components, a Field Programmable Gate Array (FPGA) or Application Specific Integrated Circuit (ASIC), which performs certain tasks or provides the associated functionality. In some embodiments, the described elements may be configured to reside on a tangible, persistent, addressable storage medium and may be configured to execute on one or more processors. These functional elements may in some embodiments include, by way of example, components, such as software components, object-oriented software components, class components and task components, processes, functions, attributes, procedures, subroutines, segments of program code, drivers, firmware, microcode, circuitry, data, databases, data structures, tables, arrays, and variables. Although the example embodiments have been described with reference to the components, modules and units discussed herein, such functional elements may be combined into fewer elements or separated into additional elements.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method of performing magnetic resonance (MR) imaging, the method comprising:
    during a first cardiac cycle of a subject, generating a first imaging sequence for application to a subject, the first imaging sequence comprising a first preparatory pulse and an inversion recovery pulse following the first preparatory pulse, and detecting first signals emitted from the subject in response to the first imaging sequence;
    generating first image data based on the first signals;
    during a second cardiac cycle immediately following the first cardiac cycle, generating a second imaging sequence for application to the subject, the second imaging sequence comprising a second preparatory pulse, and detecting second signals emitted from the subject in response to the second imaging sequence;
    generating second image data based on the second signals; and
    combining the first and second image data to produce composite image data,
    wherein the second imaging sequence does not comprise an inversion recovery pulse following the second preparatory pulse, and
    wherein the first preparatory pulse of the first imaging sequence or the second preparatory pulse of the second imaging sequence is a magnetization transfer contrast (MTC) pulse or a train of MTC pulses.

2. The method of claim 1, wherein the first signals and the second signals are emitted from one or more portions of the subject's heart, and wherein the first and second image data are cardiac image data.

3. The method of claim 1, further comprising repeating the generation of the first and second imaging sequences during a plurality of cardiac cycles so as to generate a first image dataset and a second image dataset.

4. The method of claim 3, wherein the first image dataset represent a first 3D image volume of the subject, and wherein the second image dataset represents a second 3D image volume of the subject.

5. The method of claim 4, wherein the first image data set represents a first 3D cardiac image, and wherein the second image dataset represents a second 3D cardiac image.

6. The method of claim 1, wherein the first and second image data are bright-blood image data.

7. The method of claim 1, wherein the composite image data is a black-blood image data.

8. The method of claim 1, wherein combining the first and second image data is performed using a phase sensitive inversion recovery (PSIR) algorithm.

9. The method of claim 1, wherein the second imaging sequence comprises a fat saturation pulse following the second preparatory pulse.

10. The method of claim 1, wherein the first imaging sequence or the second imaging sequence further comprise a motion estimation sequence following the corresponding first preparatory pulse or second preparatory pulse.

11. The method of claim 10, further comprising using the motion estimation sequence to correct for subject motion during the first and/or the second imaging sequence.

12. The method of claim 1, wherein the first and/or the second imaging sequence comprises localizing gradients.

13. The method of claim 1, wherein the generation of the first and/or the second imaging sequence are triggered by ECG signals.

14. A magnetic resonance (MR) apparatus, comprising:
    a gradient system to apply a gradient magnetic field;
    an excitation system to apply an excitation pulse to a subject and to receive signals from the subject; and
    a computing system to receive the signals from the excitation system, the computing system to execute program code to:
        control the gradient system and the excitation system, during a first cardiac cycle of a subject, to generate a first imaging sequence for application to the subject, the first imaging sequence comprising a first preparatory pulse and an inversion recovery pulse following the first preparatory pulse, and to detect first signals emitted from the subject in response to the first imaging sequence;
        generate first image data based on the first signals;
        control the gradient system and the excitation system, during a second cardiac cycle immediately following the first cardiac cycle, to generate a second imaging sequence for application to the subject, the second imaging sequence comprising a second preparatory pulse, and to detect second signals emitted from a subject in response to the second imaging sequence;
        generate second image data based on the second signals; and
        combine the first and second image data to produce composite image data,
        wherein the second imaging sequence does not comprise an inversion recovery pulse following the second preparatory pulse, and
        wherein the first preparatory pulse of the first imaging sequence or the second preparatory pulse of the second imaging sequence is a magnetization transfer contrast (MTC) pulse or a train of MTC pulses.

15. A non-transitory computer-readable data storage medium encoded with programming instructions, said storage medium being loaded into a computer system of a magnetic resonance (MR) apparatus, and said programming instructions causing said computer system to operate the MR apparatus so as to:

during a first cardiac cycle of a subject, generate a first imaging sequence for application to a subject, the first imaging sequence comprising a first preparatory pulse and an inversion recovery pulse following the first preparatory pulse, and detect first signals emitted from the subject in response to the first imaging sequence;

generate first image data based on the first signals;

during a second cardiac cycle immediately following the first cardiac cycle, generate a second imaging sequence for application to the subject, the second imaging sequence comprising a second preparatory pulse, and detect second signals emitted from the subject in response to the second imaging sequence;

generate second image data based on the second signals; and combine the first and second image data to produce composite image data, wherein the second imaging sequence does not comprise an inversion recovery pulse following the second preparatory pulse, and wherein the first preparatory pulse of the first imaging sequence or the second preparatory pulse of the second imaging sequence is a magnetization transfer contrast (MTC) pulse or a train of MTC pulses.

\* \* \* \* \*